United States Patent [19]

Shiratani

[11] Patent Number: 4,525,867
[45] Date of Patent: Jun. 25, 1985

[54] RADIO RECEIVER

[75] Inventor: Yuji Shiratani, Nagaokakyo, Japan

[73] Assignee: Mitsubishi Denki Kabushiki Kaisha, Tokyo, Japan

[21] Appl. No.: 461,977

[22] Filed: Jan. 26, 1983

Related U.S. Application Data

[63] Continuation-in-part of Ser. No. 288,366, Jul. 30, 1981, abandoned.

[30] Foreign Application Priority Data

| Jul. 30, 1980 | [SE] | Sweden | 8104602 |
| Aug. 4, 1980 | [JP] | Japan | 55-108556 |
| Aug. 4, 1980 | [JP] | Japan | 55-108567 |
| Aug. 4, 1981 | [DE] | Fed. Rep. of Germany | 3130864 |

[51] Int. Cl.³ .......................... H04B 1/10; H04B 1/26
[52] U.S. Cl. .................................. 455/194; 455/166; 455/221
[58] Field of Search .............. 455/161, 194, 221, 212, 455/218, 225, 185, 186, 166; 381/94

[56] References Cited

U.S. PATENT DOCUMENTS

| 4,253,194 | 3/1981 | Van Deursen | 455/161 |
| 4,414,687 | 11/1983 | Hirata | 455/194 |
| 4,420,694 | 12/1983 | Yokota et al. | 455/212 |
| 4,430,753 | 2/1984 | Shiratani | 455/166 |

OTHER PUBLICATIONS

Das neue MCC-Autoradio sucht sich stets den starksten Programmsender Funk-Technik—34 Jahrgang—Nr. 10/1979, pp. 475-476.

Primary Examiner—Marc E. Bookbinder
Attorney, Agent, or Firm—Wenderoth, Lind & Ponack

[57] ABSTRACT

A control unit tunes a tuner to a broadcasting station as determined by frequency data stored in a memory and then to another broadcasting station as determined by other frequency data stored in the memory while it applies a muting pulse to a muting circuit to mute an output from the tuner for a relatively short time. Subsequently, the tuner is tuned to that station having a higher reception level. An audio level sensor connected to the tuner is connected to one input of an AND gate whose other input is supplied with an output from the control unit originating from a command muting signal. When the sensor senses that an audio level of the tuner's output is approximating a zero level, the sensor supplies an output to the AND gate so as to permit the control unit to apply the muting signal to the muting circuit.

3 Claims, 4 Drawing Figures

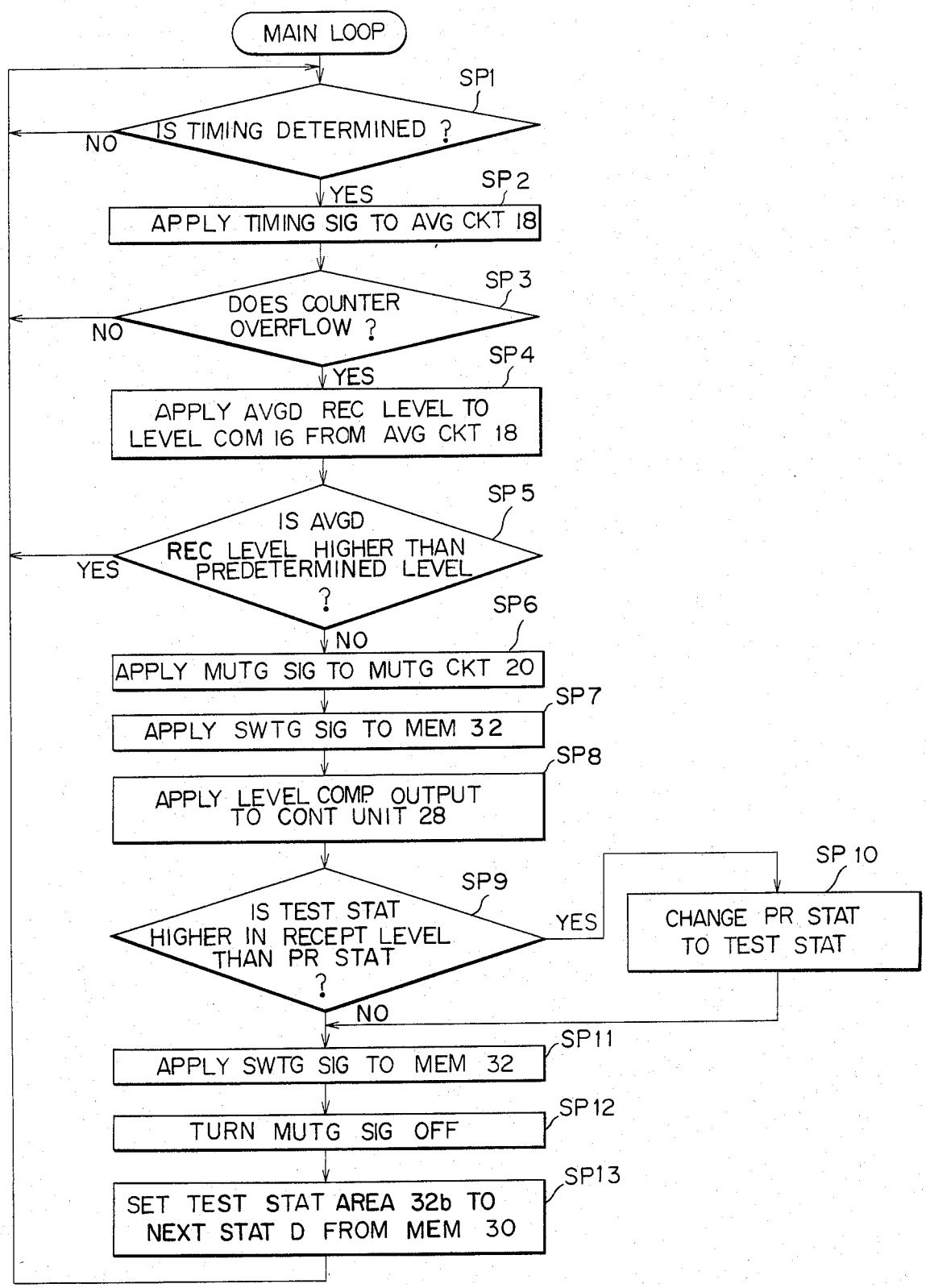

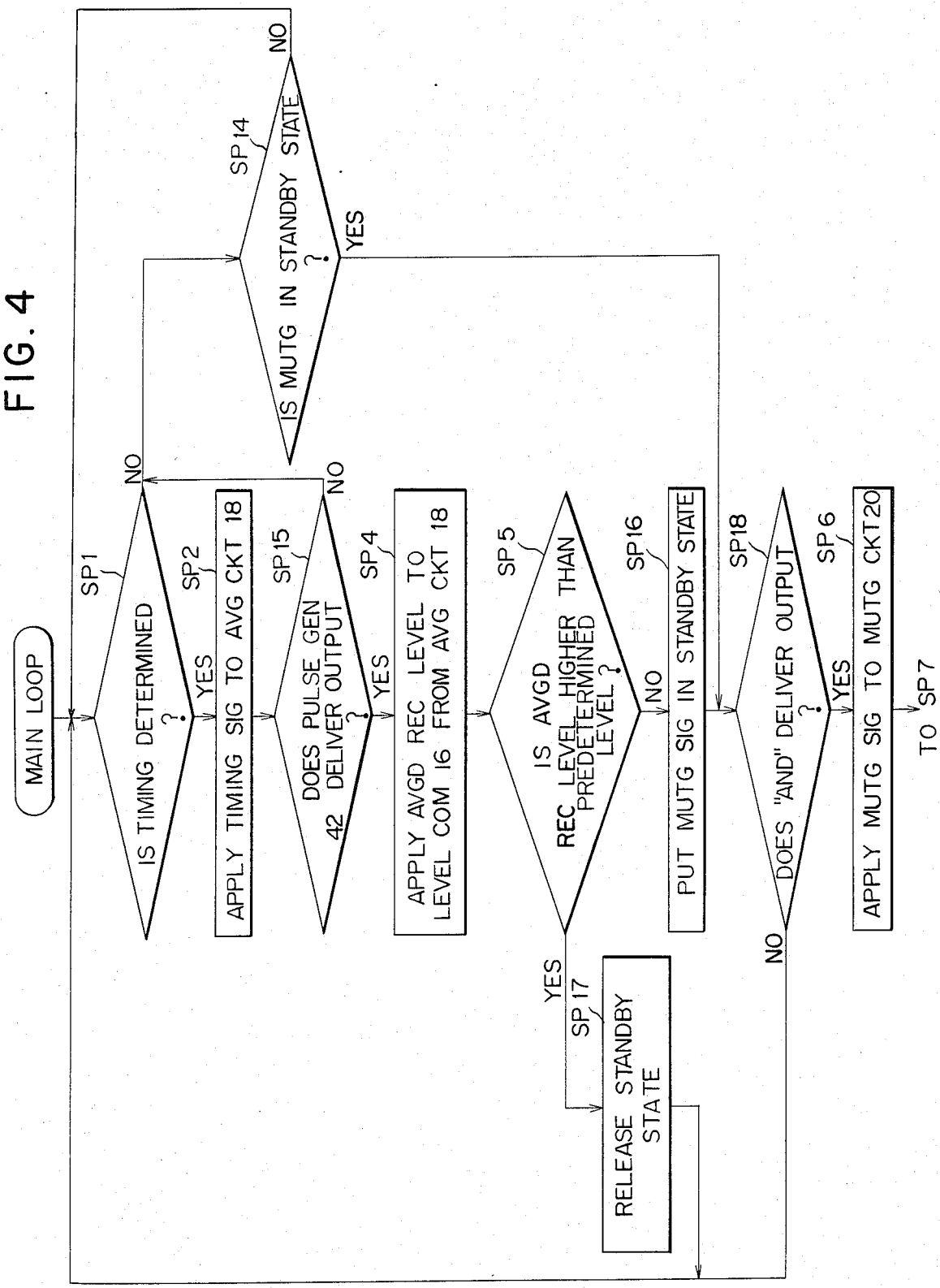

RADIO RECEIVER

CROSS REFERENCE TO RELATED APPLICATIONS

This is a continuation-in-part of now abandoned U.S. patent application Ser. No. 288,366 filed July 30, 1981.

BACKGROUND OF THE INVENTION

This invention relates to radio receiver, and more particularly to a radio receiver including a muting circuit for suspending temporarily a voice output therefrom.

In order to select a broadcasting station having the optimum reception level from a plurality of broadcasting stations respectively transmitting a common broadcast program at different frequencies, the listener mutes or suspends temporarily the reception of one of such broadcasting stations during the reception thereof and senses a reception level of a different one thereof. At that time, a muting circuit is used to suspend temporarily the reception of the one broadcasting station (which may be called hereinafter "the present station").

In radio receivers including the muting circuit, it has been a common practice to immediately suspend the voice output therefrom in response to instructions for the suspension of the voice output, independently of the level of the voice output. This might result in the generation of clicks at the moment the voice output is suspended and particularly when the voice output is at its highest audio level. That is, the voice signal falls suddenly from it high to its null level, resulting in the occurrence of pulse noise. Accordingly, there has been proposed a method of preventing the generation of clicks by incorporating a time constant circuit into the muting circuit to thereby reduce a sudden change in level of the voice output upon the suspension thereof. However, that method has been unable to completely prevent the generation of clicks.

Accordingly, it is an object of the present invention to provide a new and improved radio receiver which is substantially free from any intermission of sound preceived by the listener upon the suspension of a broadcasting station now received by the receiver in order to sense a reception level of a different broadcasting station during the reception of the present station.

SUMMARY OF THE INVENTION

The present invention provides a radio receiver arranged during the movement thereof to selectively receive a common broadcast program from a plurality of scattered broadcasting stations respectively transmitting the common broadcast program at different frequencies, wherein there are provided tuner means, a muting circuit electrically coupled to the tuner means for suspending a voice output from the receiver, a command station selecting means for instructing the reception of the common broadcast program, a frequency date memory means for storing preliminarily frequency data of at least two of the broadcasting stations, a first tuning control means responsive to instructions from the command station selecting means for tuning the tuner means to a first one of the broadcasting stations having a first one of the frequency data stored in the frequency data memory means, a muting means for applying a muting signal with a relatively short duration to the muting means to mute an output from the tuner means, a second tuning control means for tuning the tuner means to a second one of the broadcasting stations having a second one of the frequency data stored in the frequency data means for the relatively short time interval when the tuner means is tuned to the first broadcasting station, a level comparison means for comparing a first reception level at which the tuner means is tuned to the first broadcasting station with a second reception level at which the tuner means is tuned to the second broadcasting station, and third tuning control means for changing the tuning of the tuner means from the first to the second broadcasting station in response to the second reception level being in excess of the first reception level as determined by the level comparison means.

The radio receiver further comprises an audio level sensor means for sensing an audio level of the output from the tuner means, a command muting means for instructing the muting by the muting circuit and muting control means for controlling the muting circuit in accordance with both an output from the audio level sensor means and that from the command muting means.

Preferably the muting control means may include a standby means for the delivery of the muting signal and a release means for releasing the delivery of the muting signal from the standby state in response to the output from the audio level sensor means and an output from the standby means applied thereto.

BRIEF DESCRIPTION OF THE DRAWINGS

The present invention will become more readily apparent from the following detailed description taken in conjunction with the accompanying drawings in which:

FIG. 3 is a flow chart for programming the operation of the arrangement shown in FIG. 1; and FIG. 4 is a chart similar to FIG. 3 but illustrating the arrangement shown in FIG. 2.

DESCRIPTION OF THE PREFERRED EMBODIMENTS

Figure 1:
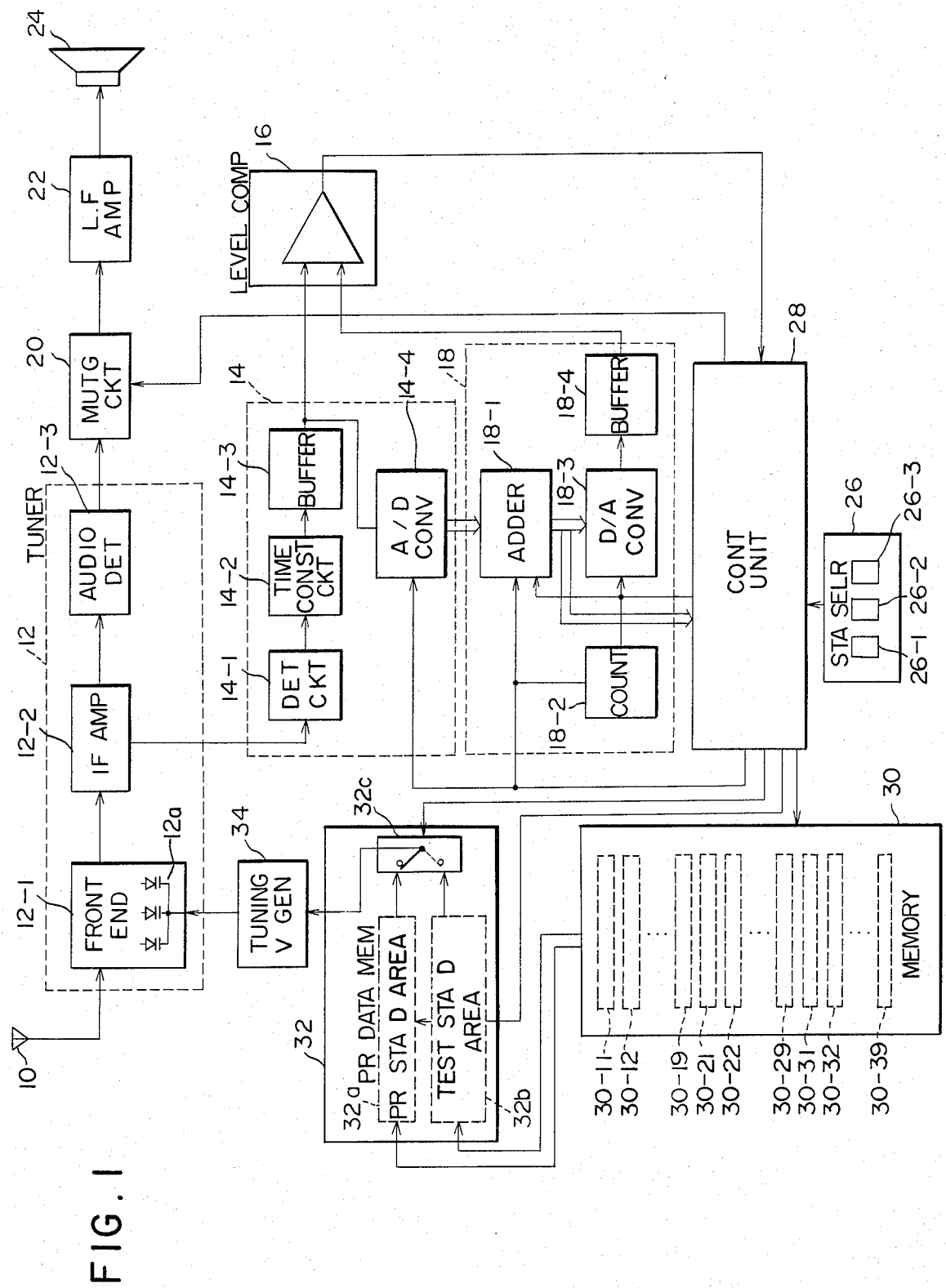
FIG. 1 is a block diagram illustrating a circuit configuration according to the radio receiver of the present invention.

Referring now to FIG. 1 of the drawings, there is illustrated a circuit configuration according to the radio receiver of the present invention. The arrangement illustrated comprises an antenna 10 which is connected to a tuner 12 and which supplies received signals to the latter. More specifically, the tuner 12 includes a front end 12-1, an intermediate frequency amplifier 12-2 and an audio detector 12-3 connected in series to one another in the named order. The front end 12-1 is tuned to a signal received by the antenna 10 and converts it to an intermediate frequency signal, and the intermediate frequency amplifier 12-2 amplifies the intermediate frequency signal. Then, the audio detector 12-3 detects the amplified intermediate frequency signal to produce a corresponding audio signal. One portion of the amplified intermediate frequency signal from the intermediate frequency amplifier 12-2 is supplied to a level sensor circuit 14. In the level sensor 14, a detector circuit 14-1 detects the signal from the intermediate frequency amplifier 12-2 so as to generate a DC voltage which is, in turn, nearly averaged by a time constant circuit 14-2 and then applied to the buffer 14-3 which is connected to one input of a level comparision circuit 16 which is shown in FIG. 1 as comprising an operational amplifier. The buffer 14-3 is operative to impart to its output a magnitude suitable for the level comparator 16. The output from the buffer 14-3 is also applied to an analog-to-digital converter 14-4 where it is converted to a digital output in accordance with the timing pulses from a control unit 28 as will be described later.

Thus, the level sensor 14 is operative to sense the received level of a signal or broadcast program from a broadcasting station to which the tuner 12 or the front end 12-1 is tuned and to store the sensed level therein.

Then, the digital data from the analog-to-digital converter 14-4 is supplied to an averaging circuit 18, that is, an adder 18-1. The adder 18-1 is operative to add the digital outputs from the analog-to-digital converter 14-4 to one another in accordance with the timing pulses from the control unit 28 until a counter 18-2 counts the timing pulses from the control unit 28 to reach a full count. At that time, a digital-to-analog converter 18-3 which is connected to the adder 18-1 converts an output from the latter to an analog voltage which is, in turn, applied to the other input of the level comparison circuit 16 through a buffer 18-4 similar in purposes to the buffer 14-3. The outputs from the adder 18-1 and the counter 18-2 are applied to the control unit 28.

From the foregoing it is seen that the averaging circuit 18 averages a plurality of reception levels stored in the level sensor circuit 14. The average reception level thus provided is stored in the averaging circuit 18 as a reception level for a first broadcasting station transmitting the broadcast program which is now tuned by the tuner 12. Such a broadcasting station is called hereinafter the "present broadcasting station".

The remaining portion of the signal tuned by the tuner 12 or the front end 12-1 is applied via a muting circuit 20 to a low frequency amplifier 22 where it is amplified. The amplified signal is supplied to a loudspeaker 24 where it is converted to corresponding audio signal. The arrangement further comprises a station selector 26 including a plurality of a station selecting keys, in this case, three keys 26-1, 26-2, 26-3 serving as a command station selecting means to instruct the reception of the broadcast program, and a control unit 28 connected to the other inputs of the level sensor circuit 14 and the averaging circuit 18 and also to the muting circuit 20. As described above, the averaging circuit 18 and the level comparision circuit 16 have respective outputs connected to the control unit 28 so as to supply the present status of reception to the latter. The control unit 28 is also connected to both a memory 30 and another memory 32 as well as the muting circuit 20.

The memory 30 has a plurality of data required for the same broadcast programs to be received. In the illustrated example, the memory 30 includes the data areas 30-11, 30-12, . . . , 30-19, the data areas 30-21, 30-22, . . . , 30-29 and the data areas 30-31, 30-32, . . . , 30-39 which are respectively alloted to the station selecting keys 26-1, 26-2 and 26-3 in the station selector 26. For example, assuming that the station selecting key 26-1 is selected, the station selector 26 applies a program selecting signal originating from the station selecting key 26-1 to the control unit 28. Then, the control unit 28 causes the memory 30 to transfer frequency data stored in any of data areas 30-11 through 30-19 as determined by the program selecting signal to the memory 32 which is called hereinafter a "present data memory".

In the illustrated example, the frequency data first transferred to the present data memory 32 is those lastly received by selecting the station selecting key 26-1 just precedingly because the latter frequency data can easily be stored in the control unit 28. The frequency data for the present broadcasting station are transferred to a present station-data area 32a of the present data memory 32 while at the same time frequency data following the now transferred frequency data are transferred to a testing station data area 32b thereof. For example, when the frequency data for the present broadcasting station results from the data area 30-11 of the memory 30, the frequency data stored in the date area 30-12 thereof is transferred to the testing station data area 32b of the present data memory 32.

Subsequently, the present data memory 32 delivers the present station data stored in the present station data area 32a to a tuning voltage generator 34. The tuning voltage generator 34 generates an output voltage in response to the present station data applied thereto and applies the output voltage to three variable capacitance diodes 12a shown in FIG. 1 as being disposed in the front end 12-1.

In operation, the tuning voltage generator 34 generates first a tuning voltage as determined by the frequency data stored in the data area 32a of the present data memory 32 and then applies it to the front end 12-1 of the tuner 12 as described above. As a result, the front end 12-1 responds to the tuning voltage to be tuned to the present broadcasting station and receives a broadcast program therefrom. Thus, a first tuning control means is formed which is responsive to instructions from the control unit 28 to supply the frequency data stored in the data area 32a of the present data memory 32 to the tuning voltage generator 34 so as to thereby tune the tuner 12 or the front end 12-1 to the present station corresponding to the frequency data stored in the data area 32a of the memory 32. The broadcast program or a signal from the present station received by the tuner 12 is applied to the level sensor circuit 14 which also receives one pulse of a pulse train having the pulse width of a few milliseconds for each second from the control unit 28. The level sensor circuit 14 senses a reception level between each pair of adjacent pulses and applies a sensed level signal to the averaging circuit 18. It is noted that, due to the presence of the time constant circuit 14-2, this sensing of the reception level is effected with a small time constant corresponding to less than the few milliseconds but not instantaneously. Thus, the reception level is sensed only once within the few milliseconds and retained until the next succeeding sensing is effected. The averaging circuit 18 accumulates and averages the reception levels in accordance with pulses of the abovementioned apulse train applied thereto. The averaged reception level is supplied to both the level comparison circuit 16 and the control unit 28. The level comparison circuit 16 determines if the averaged reception level is not higher than a predetermined magnitude. If so, the control unit 28 is operated to examine the reception status for a second broadcasting station at predetermined time periods. The second broadcasting station is called hereinafter a "tested broadcasting station".

More specifically, the control unit 28 supplies a command muting signal to the muting circuit 20 to attenuate and mute an output level of an audio signal from the latter. That is, the loudspeaker 24 is muted.

Following this, the present data memory 32 is operated to change the frequency data stored in the present station data area 32a to those stored in the tested station data area 32b through the switching operation of a transfer switch 32c which selectively respectively connects the present and tested station data areas 32a and 32b to the tuning voltage generator 34 as determined by a control signal from the control unit 28. This results in the supply of the frequency data originally stored in the tested station data area 32b to the front end 12-1 of the tuner 12 through the tuning voltage generator 34. Thus, the front end 12-1 is tuned to a frequency contained in the frequency data supplied thereto to receive a broadcast program sent at that frequency. Accordingly, a second tuning control means is formed which is responsive to instructions from the control unit 28 to exchange the frequency data for the present station with those for the tested station for a relatively short time interval during the reception of the present station so as to thereby tune the tuner 12 to the tested station. Then, the level sensor circuit 14 senses a reception level of the now received programs in the same manner as described above and applies the sensed reception level to the level comparision circuit 16. Then, the level comparison circuit 16 compares the now sensed reception level of the present station stored in the averaging circuit 18 between each pair of adjacent pulses with the extremely short pulse width applied from the control unit 28. The result of the comparison is applied to the control unit 28.

More specifically, when the tested station has a lower reception level than the present station as determined by comparison circuit 16, the present data memory 32 is again operated to exchange the frequency data stored in the present station data area 32a with those stored in the tested station data area 32b as described above and the control unit 28 interrupts the supplying of the muting signal to the muting circuit 20 so as to release the muting of the audio signal. Simultaneously, the memory 30 transfers frequency data stored in the next succeeding data area, for example, the data area 30-13 to the tested station data area 32b of the present data memory 32. After the lapse of one second, for example, the control unit 28 again supplies the muting signal to the muting circuit 20 so as to mute the audio signal. At that time, the tuner 12 receives that broadcasting station corresponding to the frequency data transferred to the tested station data area 32b followed by the determination of the reception level therefor as described above.

If the tested station has a lower reception level than the present station, as determined by the comparison circuit 16, then frequency data stored in the tested station data area 32b of the present data memory 32 is successively changed to those stored in the remaining data areas 30-14, 30-15, ..., 30-19 of the memory 30 and the resulting reception levels are sensed as described above. It is now assumed that one tested station has a higher reception level than the present station, as determined by the comparison circuit 16, as described above. Under the assumed conditions, the control unit 28 senses an output from the comparison circuit 16 and releases the muting of the audio signal without changing the frequency data stored in the present station data area 32a to those stored in the tested station data area 32b. Thus, a third tuning control means is formed which is responsive to instructions from the control unit 28 and also to a tested station having a higher reception level than the present station so as to change the frequency data for the present station to those for the tested station in the present data memory 32 so as to thereby tune the front end 12-1 of the tuner 12 to the tested station. In this way, the arrangement of FIG. 1 continues to receive the broadcast program from that tested station having the highest in reception level as the new present station. At that time, since the frequency data for the present station which has transmitted the broadcast program received by the tuner 12 up to that time are stored, frequency data are changed to those stored in the next succeeding data area of the memory 10.

In this way, the broadcast program now received can be changed to that having a higher reception level in succession.

Therefore, motor vehicles equipped with the radio receiver of the present invention are traveling to leave a service area of a broadcasting station transmitting a broadcast program now received by the receiver and enter that of another broadcasting station which is identical in broadcast programs to and different in frequency from the first-mentioned station, the receiver is automatically changed to receive the latter station.

When the arrangement of FIG. 1 is changed from the present broadcasting station now received to a different broadcasting station, the present invention is operative to mute the audio signal therefrom through the operation of the muting circuit 20. At that time, the present invention also controls both an audio level of the output from the tuner 12 and the operation of the muting circuit 20 so that the listener does not receive the interruption of audio from the receiver.

Figure 2:
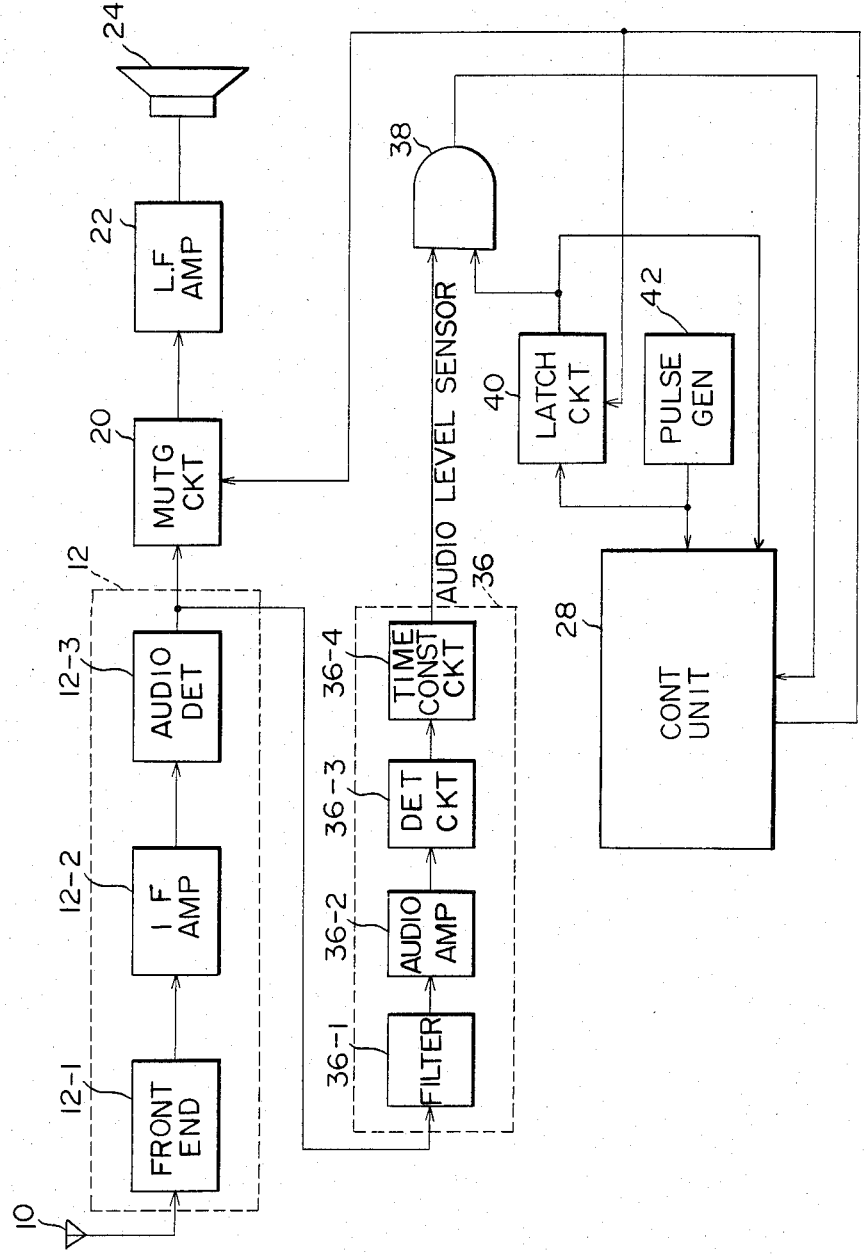
FIG. 2 is a block diagram of muting control means for controlling the operation of the muting circuit shown in FIG. 1 according to the present invention.

Referring now to FIG. 2 there is illustrated a muting control means for controlling both the audio level of the output from the front end 12-1 of the tuner 12 and the operation of the muting circuit 20 along with those components operatively coupled to the muting control means of the arrangement shown in FIG. 1. The illustrated arrangement comprises, in addition of the antenna 10, the tuner 12, the muting circuit 20, the low frequency amplifier 22 and the loudspeaker 24 as shown in FIG. 1, an audio level sensor circuit 36 connected the audio detector 12-3 of the tuner 12, and an "AND" and gate 38 having one input connected to the audio level sensor circuit 36 and the other input connected to the control unit 28 through a latch circuit 40 and having an output connected to the control unit 28 which, in turn, has another input connected to a pulse generator 42. The latch circuit 40 is also connected to the control unit 28.

The audio level sensor circuit 36 includes a filter 36-1 which receives one portion of the output from the audio detector 12-3 of the tuner 12 so as to filter out a DC component thereof and to apply only an AC component thereof to an audio amplifier 36-2 where it is amplified. The amplified AC component from the audio amplifier 36-2 is applied to a detector circuit 36-3 and then applied to one input of the "AND" gate 38 through a time constant circuit 36-4.

The pulse generator 42 generates timing pulses at predetermined constant equal time intervals of, for example, one second. The timing pulse is applied to the control unit 28 and then to the latch circuit 40 where it is latched. This latching of the timing pulse means that the command muting signal is put in its standby state.

When the audio level sensor circuit 36 has sensed and determined that the audio signal from the audio detector circuit 12-3 of the tuner 12 or the ac audio components thereof from the time constant circuit 36-4 has a magnitude approximating equal to zero, the audio level sensor circuit 36 applies a high level to one input of the "AND" gate 38. Thus, the "AND" gate 38 supplies an output to the control unit 28 so as to release the command muting signal from its standby state. Thus, the control unit 28 supplies the command muting pulse to the muting circuit 20 while at the same time the latch circuit 40 is reset. Thus, the muting circuit 20 prevents the audio signal from the tuner 12 from being transmitted to the low frequency amplifier 22, resulting in the loudspeaker 24 being silenced.

Therefore, clicks are prevented from occurring because the muting circuit 20 is initiated so as to be operated with the output from the tuner 12 having an audio level of approximately zero magnitude. Therefore, the arrangement of FIG. 2 is very effective for preventing the occurrence of clicks upon the interruption of audio as in the case radio receivers including a pair of tuners, one of which receives one of the broadcasting stations and the other of which senses a reception state of a different one of the broadcasting stations by interrupting the audio resulting from one tuner for an extremely short time interval during the reception of the one broadcasting station.

From the foregoing it is seen that the present invention can effectively prevent the muting circuit from be operated unless the output from the tuner has the audio level suitable for operating the muting circuit. This ensures that noise and clicks are prevented from occurring upon the muting operation.

The arrangements shown in FIGS. 1 and 2 are operated following flow charts for programming the operations thereof as respectively shown in FIGS. 3 and 4. In FIGS. 3 and 4, the tuner 12 is tuned to the present broadcasting station and the loudspeaker 24 produces a corresponding audio signal which is designated by a block labelled "MAIN LOOP".

Step SP1 asks if the timing is suitable for entering a reception level of the present station for determination purposes with local clock pulses counted in the control unit 28.

Step SP2 is responsive to a predetermined count to apply a timing signal to the analog-to-digital converter 14-4, the adder 18-1 and the counter 18-2. That is, the averaging circuit 18 receives a command entry of the reception level and the adder 18-1 receives a command addition while a count by the counter 18-2 is initiated.

Step SP3 ask if the counter 18-2 overflows or if the counter has received a predetermined number of timing signals. For example, it is assumed that, in order to generate command signals at time intervals of one second, the counter reaches a full count upon the reception of ten timing signals for the entry of the reception level, i.e., the counter receives one timer signal each 0.1 second.

Step SP4 applies an averaged reception level of the present station to the level comparison circuit 16 from the averaging circuit 18.

Step SP5 determines whether or not the averaged reception level is higher than a predetermined level by the level comparison circuit 16.

Step SP6 applies a command muting signal to the muting circuit 20. At that time the latch circuit 40 is reset (see SP17 shown in FIG. 4).

Step SP7 applies a switching signal to the switch 32c in the present data memory 32.

Step SP8 applies an output from the level comparison circuit 16 to the control unit 28.

Step SP9 asks if the tested station has a higher reception level than the present station.

Step SP10 applies to the present data memory 32 a command signal from the control unit 28 for exchanging the present station data area 32a for the tested station data area 32b.

Step SP11 applies to the memory 32 a command switching signal for changing over the switch 32c.

Step SP12 turns the command muting signal off.

Step SP13 sets the tested station data area 32b of the memory 32 to the next succeeding statin data from the memory 30.

Step SP14 asks if the command muting signal is put in the standby state. This is effected by checking an output from the latch circuit 40.

Step SP15 asks if the pulse generator 42 delivers an output. In other words, it asks whether or not the generator 42 produces relatively short pulses at predetermined constant time intervals.

Step SP16 puts the command muting signal in the standby state. In other words, the control unit 28 is put in its standby state so that it delivers the command muting signal to the muting circuit 20 in response to the output from the "AND" gate 28. That is, the control unit 28 is waiting for the results of the determination of a reception level of another broadcast station.

Step SP17 releases the command muting signal from its standby state.

Step SP18 asks if the "AND" gate delivers an output.

While the present invention has been illustrated and described in conjunction with a single preferred embodiment thereof, it is to be understood that numerous changes and modifications may be resorted to without departing from the spirit and scope of the present invention. For example, the muting circuit may have incorporated thereinto the so-called soft clamp circuit for imparting thereto a time constant upon again producing the audio signal from the loudspeaker. Also, the AND gate may be disposed within the control unit. Furthermore, by using a microcomputer, the control unit 28 may include the averaging circuit 18, the level comparison circuit 16 in a digital form, the memories 30 and 32, the pulse generator 40 and the "AND" gate 38.

What is claimed is:

1. A radio receiver comprising: an antenna for inducing a signal thereon; a tuner means which is supplied with said signal from said antenna; a muting circuit electrically coupled to said tuner means to mute an output from said tuner means in response to a command muting signal supplied thereto; an audio level sensor means for sensing an audio level of an audio analog signal resulting from said output from said tuner means, said audio level sensor means being responsive to the sensed audio level of said audio analog signal which is not higher than a predetermined magnitude so as to deliver an audio level sensed signal; and AND gate having one input connected to said audio level sensor means; a pulse generator means for generating timing pulses at predetermined constant equal time intervals, said timing pulses acting as said command muting signal; a latch circuit connected to said pulse generator means to latch therein said timing pulses from said pulse generator means, said latch circuit having its output connected to another input of said AND gate; and a control unit connected to outputs of said AND gate, said latch circuit and said pulse generator means, said control unit having its output connected to both said latch circuit and said muting circuit; wherein said latch circuit puts said command muting signal from said pulse generator means in a standby state, and said AND gate is responsive to the reception of said audio level sensed signal from said audio level sensor means so as to generate a signal for releasing said command muting signal from said standby state so as to thereby cause said control unit to supply said command muting signal to said muting circuit and to also reset said latch circuit.

2. A radio receiver as claimed in claim 1, further comprising a broadcast program changing means for changing a common broadcast program from a first one of a plurality of broadcasting stations which are respectively transmitting said common broadcast program at different frequencies to a second one of said broadcasting stations during the reception of said first broadcasting station when said muting is effected, and a means for determining a reception level of said second broadcasting station and then tuning said tuner means to said first broadcasting means while removing said muting.

3. A radio receiver as claimed in claim 1, wherein said predetermined magnitude approximates a zero magnitude.

* * * * *